US008410009B2

(12) United States Patent
Suzuki et al.

(10) Patent No.: US 8,410,009 B2
(45) Date of Patent: Apr. 2, 2013

(54) CERAMIC MEMBER, PROBE HOLDER, AND METHOD FOR MANUFACTURING CERAMIC MEMBER

(75) Inventors: Kohei Suzuki, Kanagawa (JP); Shinya Miyaji, Kanagawa (JP); Shinji Saito, Kanagawa (JP); Noriyoshi Kaneda, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 13/322,177

(22) PCT Filed: Apr. 27, 2010

(86) PCT No.: PCT/JP2010/057489

§ 371 (c)(1), (2), (4) Date: Nov. 23, 2011

(87) PCT Pub. No.: WO2010/137440

PCT Pub. Date: Dec. 2, 2010

(65) Prior Publication Data

US 2012/0067145 A1 Mar. 22, 2012

(30) Foreign Application Priority Data

May 28, 2009 (JP) ................................. 2009-129438

(51) Int. Cl.
*C04B 35/583* (2006.01)

(52) U.S. Cl. ..................................... 501/96.4; 73/866.5

(58) Field of Classification Search ................. 501/96.4; 73/866.5

See application file for complete search history.

(56) References Cited

FOREIGN PATENT DOCUMENTS

| JP | 01-313363 A | 12/1989 |
|---|---|---|
| JP | 2002-356374 A | 12/2002 |
| JP | 2005-119941 A | 5/2005 |

OTHER PUBLICATIONS

Hubacek, et al. "Effect of the Orientation of Boron Nitride Grains on the Physical Properties of Hot-Pressed Ceramics," Journal of the American Ceramic Society, vol. 82, No. 1, Jan. 1999.

International Search Report for PCT/JP2010/057489 issued Jun. 15, 2010.

*Primary Examiner* — Karl Group

(74) *Attorney, Agent, or Firm* — Edwards Wildman Palmer LLP

(57) ABSTRACT

Provided are a ceramic member being a sintered body including at least forsterite and boron nitride as major components, and in which the boron nitride is oriented in one direction, a probe holder formed by using the ceramic member, and a method for manufacturing the ceramic member. In the ceramic member, the index of orientation preference is equal to or lower than 0.07, and the coefficient of thermal expansion at 20 to 300° C. in a direction parallel to the direction of orientation is (3 to 5)$\times 10^{-6}$/° C., or the three-point bending strength based on JIS R 1601 is equal to or higher than 250 MPa.

6 Claims, 6 Drawing Sheets

S
11
A
A
D
p 2
4
w
3
1
5
7
8
6

CERAMIC MEMBER, PROBE HOLDER, AND METHOD FOR MANUFACTURING CERAMIC MEMBER

FIELD

The present invention relates to a ceramic member obtained by sintering a material having predetermined composition, a probe holder for holding probes that is formed by using the ceramic member and applied to an electrical property test for a semiconductor integrated circuit or the like, and a method for manufacturing the ceramic member.

BACKGROUND

Conventionally, micro contactors used for a test for a semiconductor or a test for liquid crystal include a thin plate-shaped probe holder with a number of minute through holes formed therein so as to insert probes that electrically connect a circuit structure of an object of a test and a circuit structure that transmits a signal used for the test. For such a probe holder, a ceramic member (machinable ceramics) having free-machining characteristics is used (for example, refer to Patent Literature 1).

CITATION LIST

Patent Literature

Patent Literature 1: Japanese Patent No. 3890915

SUMMARY

Technical Problem

Such a micro contactor is used in an environment of temperature changing from normal temperature to high temperature, such as a burn-in test for a silicon wafer, for example. Therefore, it is preferable that such a probe holder has, in addition to the free-machining characteristics described above, the coefficient of thermal expansion close to that of silicon so as to prevent a bad contact of probes from occurring in the test because of a difference in the coefficient of thermal expansion from that of silicon.

In recent years, as such a micro contactor has been designed to have a narrower probe pitch, the number of probes is required to increase. If the number of probes increases in such a micro contactor and the holder size remains unchanged, a warp in the micro contactor increases because the total initial load of springs increases. If a warp increases, the contact state of probes in the micro contactor becomes unstable in the center and ends of the wafer. Therefore, the ceramic member is required to have still higher strength.

The present invention has been made in view of the above, and an object of the present invention is to provide a ceramic member having high strength, free-machining characteristics, and the coefficient of thermal expansion close to that of silicon, and to provide a probe holder formed by using the ceramic member and a method for manufacturing the ceramic member.

Solution to Problem

To solve the problem described above and achieve the object, a ceramic member according to the present invention is a sintered body containing at least forsterite and boron nitride as major components, wherein the boron nitride is oriented in one direction.

In the ceramic member according to the present invention as set forth in the invention described above, an index of orientation preference is equal to or lower than 0.07, the index of orientation preference being calculated by $(I_{(100)}/I_{(002)})\|/(I_{(100)}/I_{(002)})\perp$ using a ratio $(I_{(100)}/I_{(002)})\|$ of strength $I_{(100)}$ in an X-ray diffraction along a plane (100) to strength $I_{(002)}$ in an X-ray diffraction along a plane (002) of a boron nitride crystal when being irradiated with an X-ray in a direction perpendicular to a direction of orientation of the boron nitride, and a ratio $(I_{(100)}/I_{(002)})\perp$ of the strength $I_{(100)}$ in the X-ray diffraction along the plane (100) to the strength $I_{(002)}$ in the X-ray diffraction along the plane (002) when being irradiated with an X-ray in the direction of orientation.

In the ceramic member according to the present invention as set forth in the invention described above, coefficient of thermal expansion based on JIS R 1618 at 20 to 300° C. in a direction parallel to the direction of orientation of the boron nitride is (3 to 5)$\times 10^{-6}$/° C.

In the ceramic member according to the present invention as set forth in the invention described above, three-point bending strength based on JIS R 1601 is equal to or higher than 250 MPa.

In the ceramic member according to the present invention as set forth in the invention described above, the boron nitride has a hexagonal crystal structure, and is a scaly particle.

To solve the problem described above and achieve the object, a probe holder according to the present invention that includes a through hole into which a probe formed of a conductive material is capable of being inserted, and that houses the probe, includes a base material formed by using the ceramic member, wherein the through hole is formed in a direction perpendicular to the direction of orientation of the boron nitride in the base material.

To solve the problem described above and achieve the object, a method for manufacturing a ceramic member according to the present invention includes: mixing boron nitride, silicon nitride, magnesium oxide, and a sintering additive; exerting an external force directing in one direction on a mixture mixed at the mixing; and sintering the mixture.

In the manufacturing method of ceramic member according to the present invention as set forth in the invention described above, the sintering additive includes yttrium oxide and aluminum oxide.

In the manufacturing method of ceramic member according to the present invention as set forth in the invention described above, the exerting an external force and the sintering are performed collectively by hot-press sintering.

In the manufacturing method of ceramic member according to the present invention as set forth in the invention described above, sintering temperature at the sintering is 1500 to 1550° C.

In the manufacturing method of ceramic member according to the present invention as set forth in the invention described above, the sintering is performed in a reduced-pressure atmosphere or an inert atmosphere.

In the manufacturing method of ceramic member according to the present invention as set forth in the invention described above, the boron nitride has a hexagonal crystal structure, and is a scaly particle.

Advantageous Effects of Invention

According to the present invention, it is possible to provide a ceramic member including at least forsterite and boron nitride as major components, having high strength, the coefficient of thermal expansion close to that of silicon, and free-machining characteristics by orienting the boron nitride in one direction, and to provide a probe holder formed by using the ceramic member.

According to the method for manufacturing a ceramic member of the present invention, it is possible to manufacture a ceramic member having high strength, the coefficient of thermal expansion close to that of silicon, and free-machining characteristics, by: mixing boron nitride, silicon nitride, magnesium oxide, and a sintering additive; exerting an external force directing in one direction on a mixture mixed at the mixing; and sintering the mixture.

DESCRIPTION OF EMBODIMENTS

Figure 1:
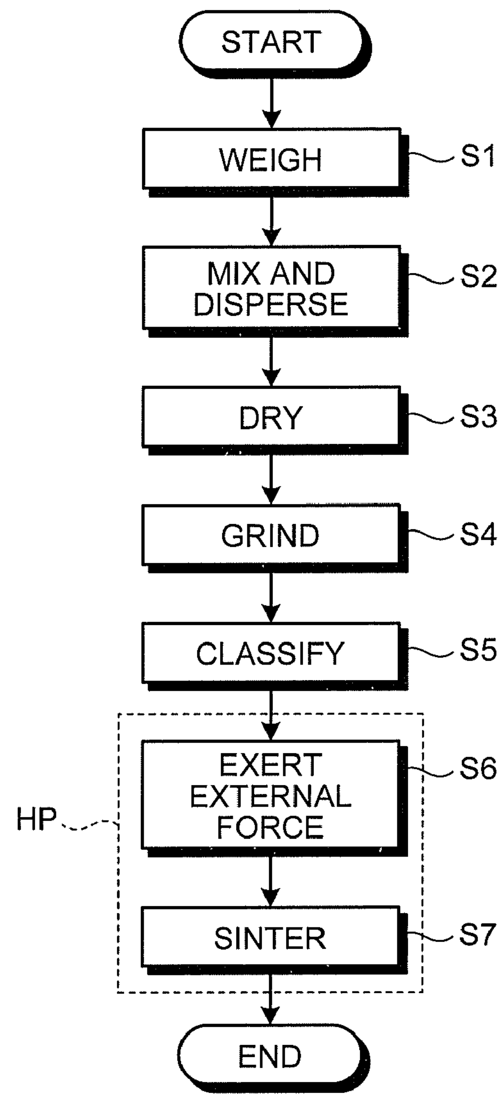
FIG. 1 is a flowchart illustrating an outline of a method for manufacturing a ceramic member according to an embodiment of the present invention.

Exemplary embodiments of a ceramic member, a probe holder, and a method for manufacturing the ceramic member according to the present invention are described below in greater detail with reference to the accompanying drawings. Note that the embodiments are not intended to limit the present invention. FIG. 1 is a flowchart illustrating an outline of a method for manufacturing a ceramic member according to an embodiment of the present invention. First, a raw material including boron nitride (BN), silicon nitride ($Si_3N_4$), and magnesium oxide (MgO) as major components, and including yttrium oxide ($Y_2O_3$) and aluminum oxide ($Al_2O_3$) as sintering additives is weighed (Step S1).

Magnesium oxide is added so as to adjust the coefficient of thermal expansion of the ceramic member to be fired. In addition to the sintering additives described above, complex oxide that has been conventionally used, such as lanthanoid metal oxide and spinel, a mixture thereof, and an additive obtained by adding magnesium oxide to the mixture can be used as the sintering additive.

The substance weighed at Step S1 is then mixed and dispersed (Step S2). Specifically, a solution obtained by adding a solvent, such as water and alcohol, to the raw material weighed at Step S1 is mixed and dispersed by a wet ball mill. The mixture obtained at Step S2 is then dried in an evaporator to eliminate the solvent (Step S3). This makes the mixture of boron nitride, silicon nitride, magnesium oxide, and the sintering additive into an aggregate in flake form. In the mixture, the content rate of boron nitride is 45 to 65% by weight, the content rate of silicon nitride is 15 to 24% by weight, the content rate of magnesium oxide is 15 to 23% by weight, and the rest is the sintering additive.

The aggregate of the mixture obtained at Step S3 is then ground (Step S4). At Step S4, at least one of a mortar and a dry ball mill is used depending on particle size distribution to be achieved after the grinding. The mixture is then classified by using mesh pass (Step S5), and the average particle diameter of the aggregate is made small to homogenize the particle size.

Subsequently, an external force is exerted in a predetermined direction on the mixture whose average particle diameter is made small, and whose particle size is homogenized (Step S6), and the mixture is sintered (Step S7). In the present embodiment, a hot-press sintering method can be applied to the method for sintering the mixture. The hot-press sintering method is a method for sintering a mixture while pressing the mixture disposed in a mold made of carbon in a hot-press device in a predetermined direction. Therefore, if the mixture is sintered by using the hot-press sintering method, the exerting the external force at Step S6 and the sintering at Step S7 are performed collectively (Step HP indicated by a dashed-line region in FIG. 1). The temperature of the hot-press sintering at Step HP is 1500 to 1550° C.

Boron nitride used in the present invention has a hexagonal crystal structure, and is a scaly particle. Therefore, the exertion of the external force directing in one direction causes the scale-shaped surface to align in a direction approximately orthogonal to the direction of exerting the external force. As a result, the mixture is oriented in a direction orthogonal to the direction of exerting the external force.

With the process from Step S1 to Step S7 described above, the ceramic member according to the present embodiment is manufactured. The ceramic member thus manufactured includes at least forsterite and boron nitride as major components, has excellent electrical insulation, and is oriented in one direction because the directions of surfaces of the boron nitride particles in a scaly shape are approximately aligned.

In the ceramic member thus manufactured, according to theoretically calculated values, the content rate of forsterite is 26.7 to 33.8% by weight, and the content rate of boron nitride described above is 54.8 to 65.1% by weight. The theoretically calculated values are calculated on the basis of an assumption that all of the magnesium oxide used for the raw material is used for generating forsterite.

The index of orientation preference (I.O.P.) of the sintered body obtained by the sintering is equal to or lower than 0.07. The I.O.P. used herein is a value calculated by the following Equation using a ratio $(I_{(100)}/I_{(002)})\|$ of strength $I_{(100)}$ in an X-ray diffraction along a plane (100) to strength $I_{(002)}$ in an X-ray diffraction along a plane (002) of a boron nitride crystal when a specimen is irradiated with an X-ray in a direction parallel to a pressure direction in pressure sintering, and a ratio $(I_{(100)}/I_{(002)})\perp$ of the strength $I_{(100)}$ in the X-ray diffraction along the plane (100) to the strength $I_{(002)}$ in the X-ray diffraction along the plane (002) when the specimen is irradiated with an X-ray in a direction perpendicular to the pressure direction.

$$\text{I.O.P.}=(I_{(100)}/I_{(002)})\|/(I_{(100)}/I_{(002)})\perp$$

Figure 2:
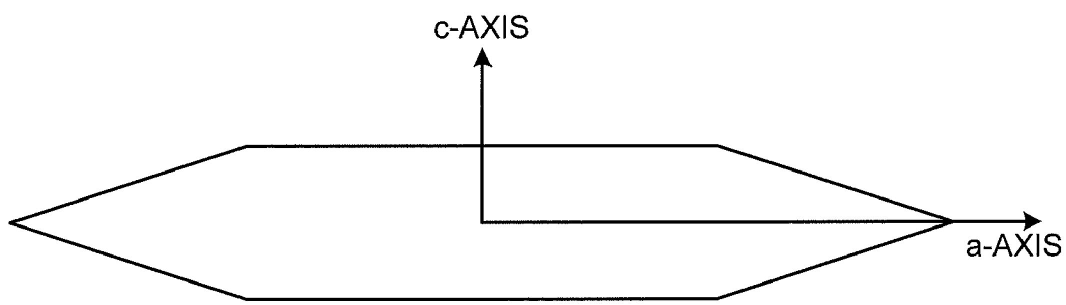
FIG. 2 is a view illustrating an a-axis and a c-axis of hexagonal boron nitride included in the ceramic member.

If I.O.P. <1 is satisfied, it means that a c-axis of the boron nitride crystal corresponding to the plane (002) is oriented in parallel to the pressure direction in the specimen, and that the surfaces of the boron nitride crystals in a scaly shape are aligned in a direction approximately perpendicular to the pressure direction. If I.O.P. >1 is satisfied, it means that an a-axis of the boron nitride crystal corresponding to the plane (100) is oriented in parallel to the pressure direction in the specimen, and that the surfaces of the boron nitride particles in a scaly shape are aligned in a direction approximately parallel to the pressure direction. If I.O.P. =1 is satisfied, it means that the directions of the boron nitride particles are random in the specimen. FIG. 2 illustrates the a-axis and the c-axis of the boron nitride particle in a scaly shape. The I.O.P. is explained in detail in J. Am. Ceram. Soc. 82 [1] 156-160 (1999) "Effect of the Orientation of Boron Nitride Grains on the Physical Properties of Hot-Pressed Ceramics." by Milan Hubacek, et al.

The coefficient of thermal expansion of the sintered body based on JIS R1618 (a method for measuring thermal expansion of fine ceramics by a thermo-mechanical analysis) is within a range of $(5.9 \text{ to } 7.5)\times10^{-6}/°$ C. in the direction of exerting the external force, and is within a range of $(3 \text{ to } 5)\times10^{-6}/°$ C. in the direction of orientation. Therefore, the coefficient of thermal expansion of the boron nitride particle in the ceramic member in the direction of orientation is a value close to coefficient of thermal expansion of silicon of $3.4\times10^{-6}/°$ C.

While the ceramic member thus manufactured is in a thin plate-shape, the ceramic member has high strength and three-point bending strength based on JIS R 1601 of 250 MPa or higher.

Figure 3:
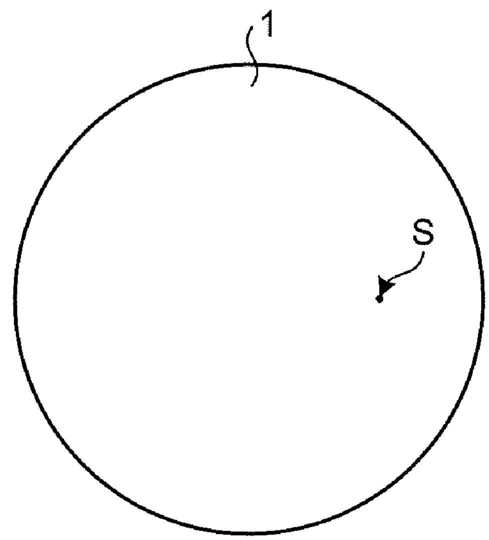
FIG. 3 is a view illustrating a structure of a probe holder formed by using the ceramic member according to the embodiment of the present invention.
Figure 4:
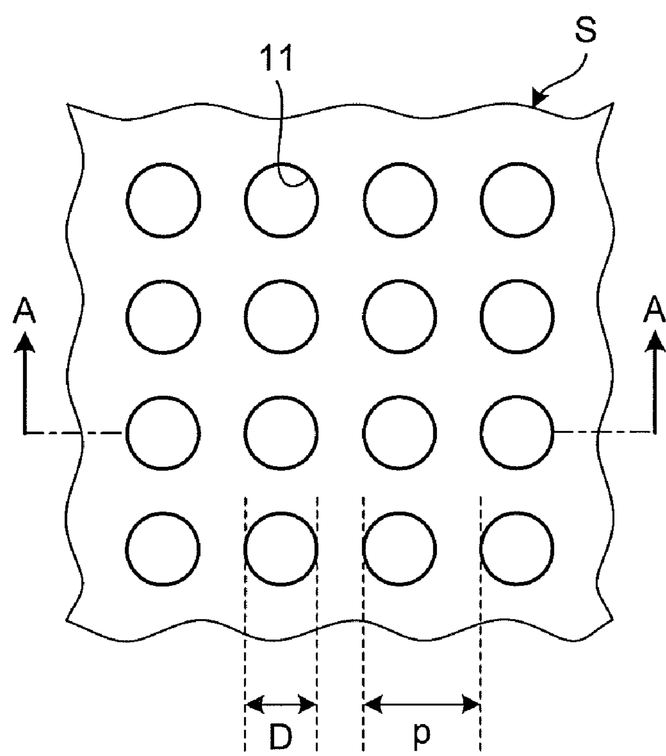
FIG. 4 is a partially enlarged view enlarging a minute region of the probe holder illustrated in FIG. 3.
Figure 5:
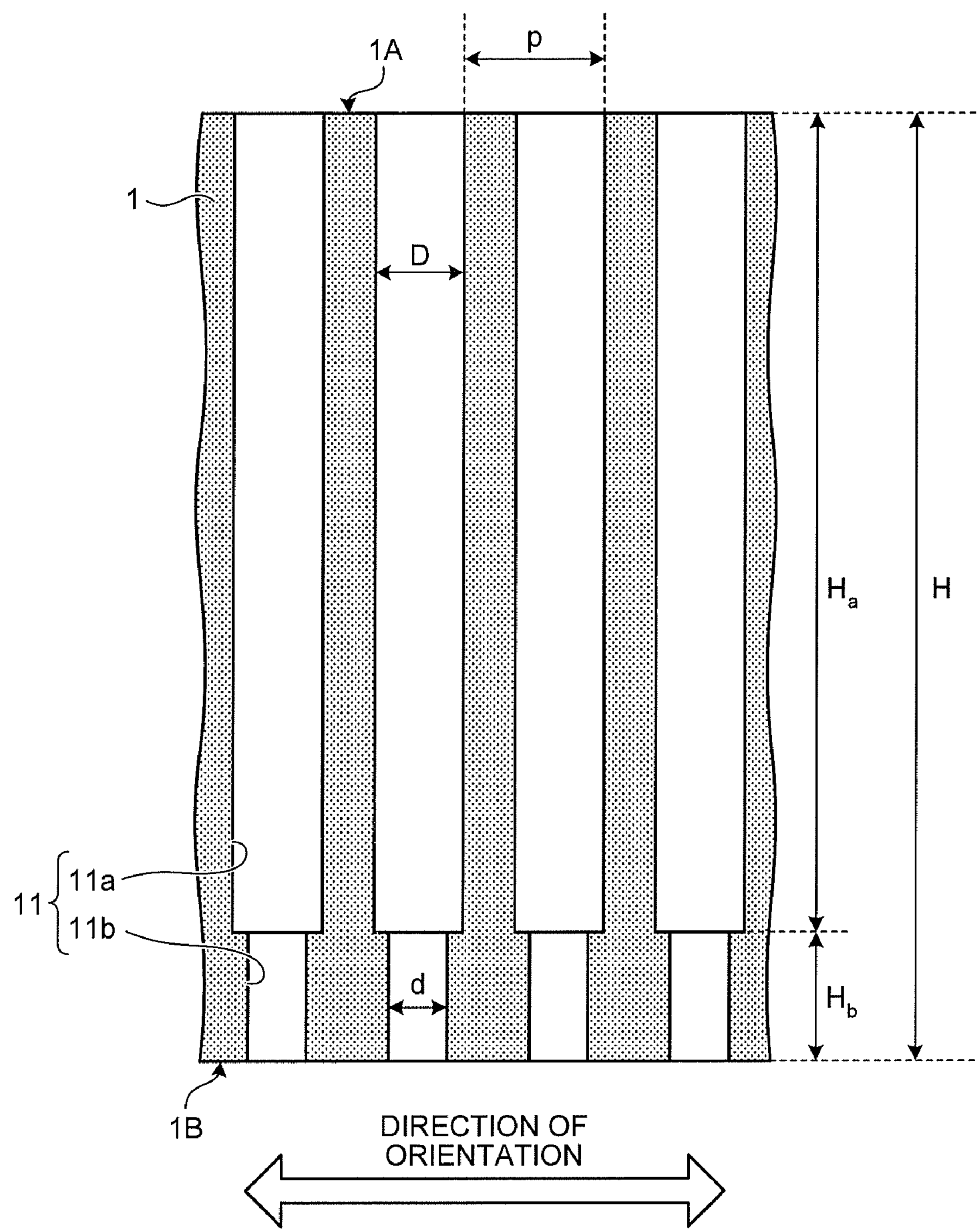
FIG. 5 is a sectional view along line A-A in FIG. 4.

The ceramic member according to the present embodiment can be applied to an insulating base material of a probe holder that holds a probe formed of a conductive material so as to electrically connect a circuit board, such as a silicon wafer, to be tested and a wiring board that transmits a signal used for the test. FIG. 3 is a view illustrating a structure of the probe holder according to the present embodiment. FIG. 4 is a partially enlarged view enlarging a minute region S of a probe holder 1 illustrated in FIG. 3. FIG. 5 is a sectional view along line A-A in FIG. 4. Note that the drawings are schematic, and the relationship between the thickness and the width of each portion, the ratio of the thicknesses of the portions, and the like may be different from those in an actual structure. Furthermore, it is obvious that the relationship and the ratio between sizes of the portions may be different from each other between the drawings.

The probe holder 1 illustrated in FIG. 3 to FIG. 5 is in a thin disk-shape, and forms a part of a probe card serving as a micro contactor applied to a full wafer-level test, a wafer-level burn-in test, and other tests for a silicon wafer (the structure of the probe card will be described later). The probe holder 1 is obtained by forming, in the ceramic member fired as described above, thousands of or tens of thousands of thorough holes 11 into which probes arranged in accordance with an arrangement of a silicon wafer to be tested are housed in a plate-thickness direction (vertical direction in FIG. 5). The through hole 11 includes a large-diameter portion 11*a* with a diameter D bored in the plate-thickness direction from a surface 1A facing the wiring side that transmits a signal for the test and a small-diameter portion 11*b* with a diameter d (<D) that has the same central axis as that of the large-diameter portion 11*a*, has a smaller diameter than that of the large-diameter portion 11*a*, and is bored in the plate-thickness direction from a surface 13 facing the silicon wafer to be tested in the test.

In the probe holder 1, the direction of orientation of the boron nitride particles is orthogonal to the plate-thickness direction of the probe holder 1, that is, to the piercing direction of the through hole 11. Therefore, the coefficient of thermal expansion in the horizontal direction in FIG. 5 is approximately equal to the coefficient of thermal expansion (in the horizontal direction) of the silicon wafer regardless of temperature. As a result, the probe holder 1 can bring the probe into contact with the silicon wafer accurately regardless of temperature. The direction of orientation of the boron nitride particles in the probe holder 1 only needs to intersect with the piercing direction of the through hole 11. However, it is preferable that the direction of orientation of the boron nitride particles be orthogonal to the piercing direction as described above.

In forming the through hole 11 in the probe holder 1, the flatness and the parallelism of the ceramic member are increased by using a surface grinder, then the small-diameter portion 11*b* is formed from the surface 1B to a predetermined depth $H_b$, and then the large-diameter portion 11*a* is formed by performing drill processing from the surface 1A to a predetermined depth $H_a$ ($H=H_a+H_b$). In forming the large-diameter portion 11*a* and the small-diameter portion 11*b*, drill processing using a carbide drill adapted to each diameter is performed. Alternatively, a processing technology, such as a laser, etching, die-cutting, an electron beam, an ion beam, or a wire electric discharge, may be applied. With the ceramic member according to the present embodiment, it is possible to realize such processing that makes the aspect ratio of the through hole 11 (in the small-diameter portion 11*b*, for example, a ratio $H_b/d$ of the depth $H_b$ of the hole to the diameter d) equal to or higher than 15.

Figure 6:
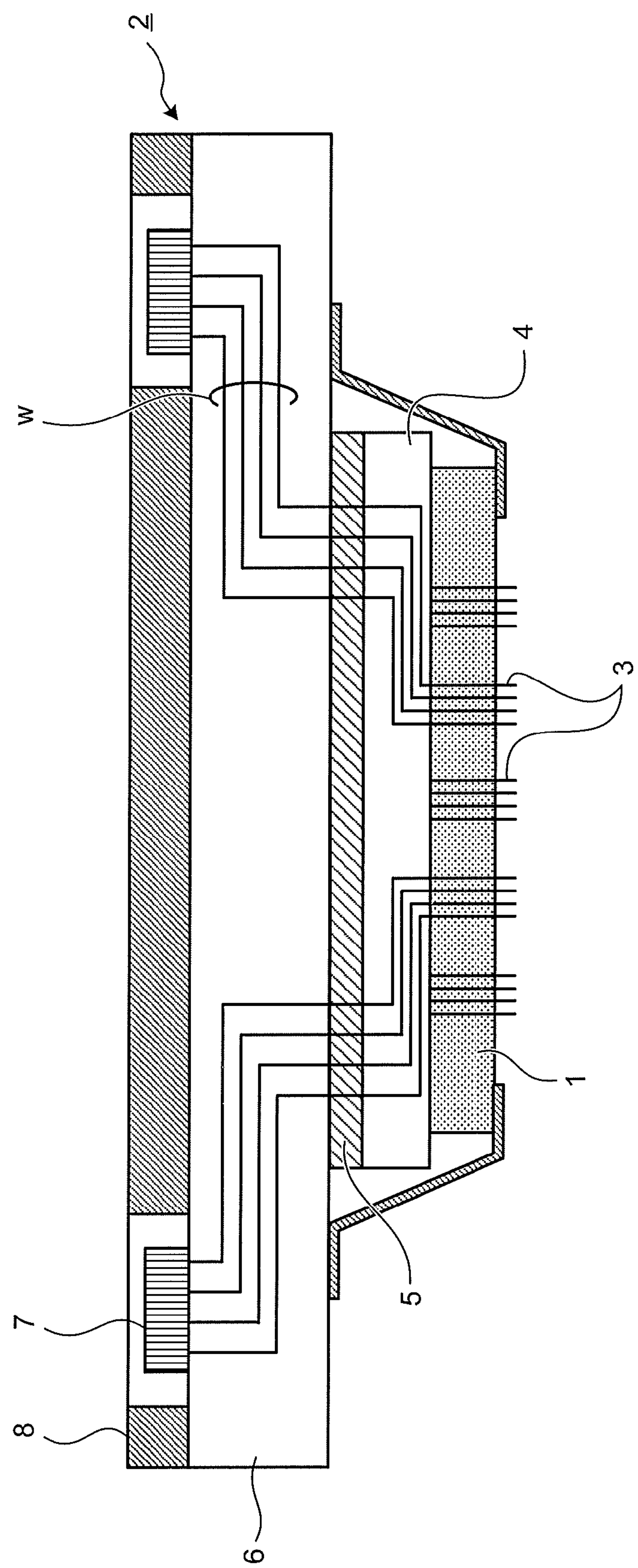
FIG. 6 is a view schematically illustrating a structure of a main portion of a probe card formed by using the probe holder according to the embodiment of the present invention.

FIG. 6 is a view schematically illustrating a structure of a main portion of the probe card formed by using the probe holder 1. A probe card 2 illustrated in the figure includes the probe holder 1 described above, a probe 3 housed and held in the through hole 11 of the probe holder 1, a space transformer 4 that transforms a space between minute wiring w in the probe holder 1, an interposer 5 that relays the wiring w extending from the space transformer 4, a wiring board 6 that connects the wiring w relayed by the interposer 5 to a testing device, a male connector 7 that is arranged on the wiring board 6 and is connected to a female connector arranged on the testing device, and a reinforcing member 8 that reinforces the wiring board 6.

Figure 7:
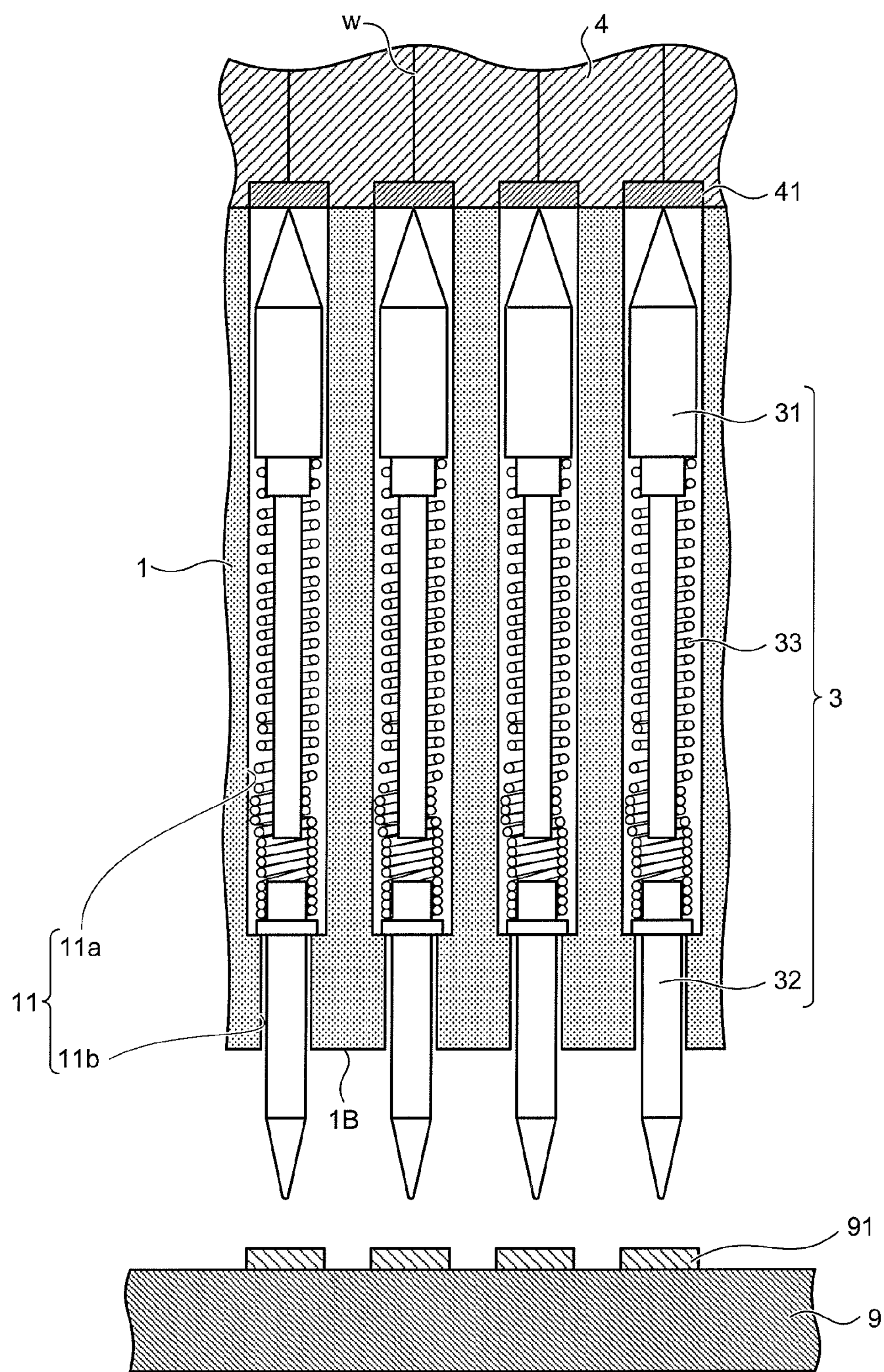
FIG. 7 is a view illustrating a detailed structure of a probe and a state of the probe held in the probe holder.

FIG. 7 is a view illustrating a detailed structure of the probe 3 and a state of the probe 3 held in the probe holder 1. In the probe 3, a needle member 31 whose end comes into contact with an electrode pad 41 arranged in the space transformer 4, a needle member 32 that protrudes from the surface 1B in a direction opposite to the needle member 31 and that comes into contact with an electrode pad 91 arranged on a silicon wafer 9, and a spring member 33 that is arranged between the needle member 31 and the needle member 32 and that connects two of the needle members 31 and 32 stretchably are connected coaxially. A flange is formed near the base end portion of the needle member 32, and is prevented from slipping out by an uneven portion serving as a juncture between the small-diameter portion 11*b* and the large-diameter portion 11*a* of the through hole 11. A specific arrangement pattern of the probe 3 in the probe holder 1 is determined in accordance with an arrangement pattern of the electrode pad 91 on the silicon wafer 9 to be tested.

The probe holder 1 can be applied to an electrical property test under various temperature conditions. The probe holder 1, for example, can be applied not only to an electrical property test under the condition that the temperature for the test is equal to the temperature of the ceramic member serving as the base material of the probe holder 1, but also to an electrical property test under the condition that the temperature for the test is higher than the temperature of the ceramic member.

With the method for manufacturing the ceramic member according to the embodiment of the present invention described above, it is possible to provide a ceramic member having high strength, the coefficient of thermal expansion close to that of silicon, and free-machining characteristics, and a probe holder formed by using the ceramic member.

Furthermore, in the probe holder 1 according to the present embodiment, the piercing direction of the probe is orthogonal to the direction of orientation of the boron nitride particles. Therefore, a change of a position, at which the probe comes into contact, caused by thermal expansion occurs following a change caused by thermal expansion of the silicon wafer. As a result, the probe holder according to the present embodiment can bring the probe into contact with the electrode pad of the silicon wafer accurately regardless of temperature even if a plurality of tests is performed under different temperature environments. Accordingly, with the probe card using the probe holder according to the present embodiment, it is not required to exchange probe holders depending on temperature zones, whereby test time and cost required for the test can be reduced.

In addition, in the present embodiment, collectively performing the exerting the external force and the sintering by the hot-press sintering method facilitates manufacturing the ceramic member. In the present embodiment, in particular, the temperature of the sintering is high temperature of 1500 to 1550° C., thereby making the ceramic member thus generated in a gray-like color. As a result, in the probe holder formed by using the ceramic member according to the present embodiment, if image processing is performed so as to detect the position of the probe in an actual test, halation occurring on the surface of the holder is reduced compared with a ceramic member in a white-like color. Therefore, the probe card using the probe holder of the present invention can improve the accuracy and the speed of detection for the position of the probe.

The exerting the external force and the sintering in the method for manufacturing the ceramic member according to the present embodiment is not limited to the hot-press sintering method. For example, a slip-cast method may be applied to the exerting the external force. If the slip-cast method is applied, the boron nitride particles are precipitated and accumulated in the mold by gravity serving as the external force. This causes the boron nitride particles to be oriented. In sintering the aggregate including the boron nitride particles thus oriented, a conventionally known sintering method, such as a reduced-pressure sintering method or an inert-atmosphere sintering method, may be applied. Furthermore, after the application of the slip-cast method, the aggregate may be sintered by using the hot-press sintering method. If the hot-press sintering method is used, the direction of orientation of the boron nitride particles caused by the slip-cast method may be orthogonal to the pressure direction in the hot-press sintering method.

The probe holder capable of being manufactured with the ceramic member according to the present embodiment is not limited to a full-wafer type that brings the probes into contact with the electrode pads on the silicon wafer collectively, and can be applied to a socket-type probe holder or the like. Furthermore, in the present embodiment, an explanation is made of the case where the probe holder housing the pin-type probe in which the pins are connected by the spring member is used. Alternatively, the ceramic member described above can be applied to a probe holder housing a probe of another type (wire-type, blade-type, and other types).

Example 1

Examples of the present invention will now be described. In Example 1, by using the method for manufacturing the ceramic member described in the embodiment, a sintered body of 90 millimeters long, 90 millimeters wide, and 5 millimeters thick was fired. In the firing, the exerting the external force and the sintering were performed collectively by the hot-press sintering method. In the hot-press sintering, pressing processing was performed in a nitrogen atmosphere of 600 mmHg at sintering pressure with contact pressure of 25 MPa in one direction, and the sintering was performed at a temperature of 1500° C. for two hours. After the firing, presence of each phase component included in the ceramic member thus fired was analyzed by an X-ray diffraction.

Figure 8:
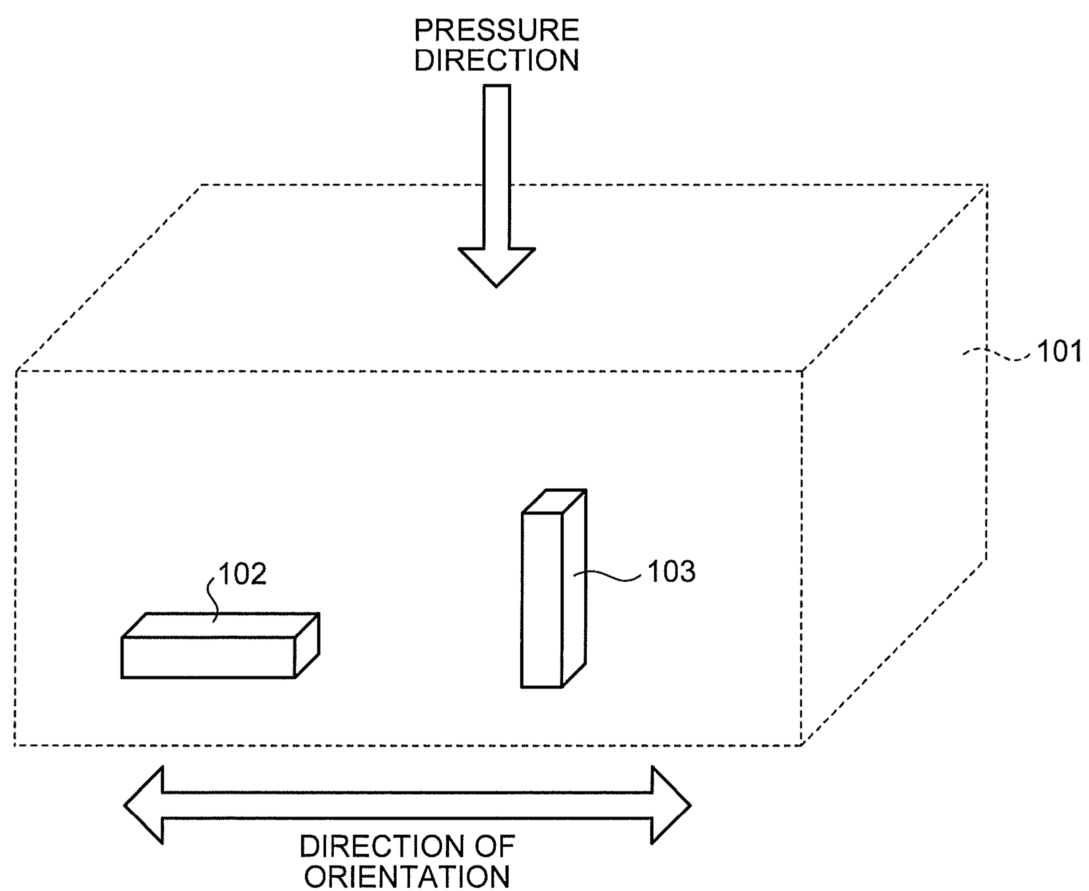
FIG. 8 is a view illustrating a specimen used for measurement of thermal expansion performed in Example 1 of the present invention.

FIG. 8 is a view schematically illustrating a specimen used for measurement in Example 1. Specifically, FIG. 8 schematically illustrates how to cut out a specimen from a sintered body 101 (indicated by a dashed line). Among two specimens 102 and 103 illustrated in the figure, the specimen 102 was fabricated for measuring thermal expansion in the direction of orientation, and the specimen 103 was fabricated for measuring thermal expansion in the pressure direction. By using the specimen 102 thus cut out, the coefficient of thermal expansion ($\times 10^{-6}$/° C.) conforming to JIS R 1618 and the three-point bending strength based on JIS R 1601 were measured. The results thereof are indicated in Table 1 together with the rates of the major components in the raw material and the sintering additives used in Example 1 (Wt %), sintering temperature (° C.), sintering pressure (MPa), and presence of each phase component included in the ceramic member thus fired.

TABLE 1

| | Major component | | | Sintering additive | | Total | Sintering temperature | Sintering pressure |
|---|---|---|---|---|---|---|---|---|
| | $Si_3N_4$ | BN | MgO | $Y_2O_3$ | $Al_2O_3$ | (Wt %) | (° C.) | (MPa) |
| Example 1 | 18.0 | 57.9 | 18.3 | 4.4 | 1.4 | 100 | 1500 | 25 |
| Example 2 | 14.9 | 65.1 | 15.2 | 3.6 | 1.2 | 100 | 1500 | 25 |
| Example 3 | 16.6 | 61.2 | 16.9 | 4.0 | 1.3 | 100 | 1500 | 35 |
| Example 4 | 18.0 | 57.9 | 18.3 | 4.4 | 1.4 | 100 | 1525 | 25 |
| Example 5 | 18.0 | 57.9 | 18.3 | 4.4 | 1.4 | 100 | 1500 | 35 |
| Example 6 | 27.2 | 54.8 | 15.9 | 1.6 | 0.5 | 100 | 1500 | 35 |
| Example 7 | 19.1 | 55.3 | 19.4 | 4.6 | 1.6 | 100 | 1500 | 35 |
| Exam- | 18.0 | 57.9 | 18.3 | 4.4 | 1.4 | 100 | 1550 | 25 |

TABLE 1-continued ple 8

| | Phase component | | | | | | | Coefficient of thermal | Bending |
|---|---|---|---|---|---|---|---|---|---|
| | BN | $2MgO \cdot SiO_2$ | MgO | α-$Si_3N_4$ | β-$Si_3N_4$ | $MgSiN_2$ | $Al_5Y_3O_{12}$ | expansion ($\times 10^{-6}$/° C.) | strength (MPa) |
| Example 1 | ○ | ○ | ○ | — | — | — | ○ | 4.5 | 299 |
| Example 2 | ○ | ○ | — | ○ | — | — | — | 3.8 | 265 |
| Example 3 | ○ | ○ | — | — | — | — | ○ | 3.8 | 256 |
| Example 4 | ○ | ○ | — | — | — | ○ | ○ | 4.5 | 273 |
| Example 5 | ○ | ○ | ○ | — | — | — | ○ | 4.5 | 300 |
| Example 6 | ○ | ○ | ○ | ○ | — | — | — | 4.4 | 315 |
| Example 7 | ○ | ○ | ○ | — | — | — | ○ | 4.7 | 302 |
| Example 8 | ○ | ○ | — | — | — | — | ○ | 3.1 | 262 |

| | Major component | | | Sintering additive | | Total | Sintering temperature | Sintering pressure |
|---|---|---|---|---|---|---|---|---|
| | $Si_3N_4$ | BN | MgO | $Y_2O_3$ | $Al_2O_3$ | (Wt %) | (° C.) | (MPa) |
| Comparative example 1 | 63.4 | 29.2 | — | 5.6 | 1.8 | 100 | 1700 | 35 |
| Comparative example 2 | 23.9 | 45.6 | 23.1 | 5.6 | 1.8 | 100 | 1700 | 35 |
| Comparative example 3 | 23.9 | 45.6 | 23.1 | 5.6 | 1.8 | 100 | 1600 | 35 |
| Comparative example 4 | 23.9 | 45.6 | 23.1 | 5.6 | 1.8 | 100 | 1500 | 35 |
| Comparative example 5 | 23.9 | 45.6 | 23.1 | 5.6 | 1.8 | 100 | 1400 | 35 |
| Comparative example 6 | 23.9 | 45.6 | 23.1 | 5.6 | 1.8 | 100 | 1300 | 35 |
| Comparative example 7 | 16.6 | 61.2 | 16.9 | 4.0 | 1.3 | 100 | 1450 | 35 |
| Comparative example 8 | 18.0 | 57.9 | 18.3 | 4.4 | 1.4 | 100 | 1500 | 15 |
| Comparative example 9 | 18.0 | 57.9 | 18.3 | 4.4 | 1.4 | 100 | 1475 | 25 |
| Comparative example 10 | 24.3 | 49.1 | 24.6 | 1.5 | 0.5 | 100 | 1500 | 35 |

| | Phase component | | | | | | | Coefficient of thermal | Bending |
|---|---|---|---|---|---|---|---|---|---|
| | BN | $2MgO \cdot SiO_2$ | MgO | α-$Si_3N_4$ | β-$Si_3N_4$ | $MgSiN_2$ | $Al_5Y_3O_{12}$ | expansion ($\times 10^{-6}$/° C.) | strength (MPa) |
| Comparative example 1 | ○ | — | — | — | ○ | — | — | 2.1 | 578 |
| Comparative example 2 | ○ | — | — | — | — | ○ | ○ | 4.0 | 156 |
| Comparative example 3 | ○ | — | — | — | — | ○ | ○ | 5.0 | 219 |
| Comparative example 4 | ○ | ○ | ○ | — | — | ○ | ○ | 5.1 | 322 |
| Comparative example 5 | ○ | ○ | ○ | ○ | — | — | ○ | 5.8 | 214 |
| Comparative example 6 | ○ | ○ | ○ | ○ | — | — | ○ | 5.7 | 29 |
| Comparative example 7 | ○ | ○ | ○ | ○ | — | — | ○ | 5.4 | 105 |
| Comparative example 8 | ○ | ○ | ○ | — | — | ○ | ○ | 4.9 | 241 |
| Comparative example 9 | ○ | ○ | ○ | ○ | — | — | ○ | 5.0 | 168 |
| Comparative example 10 | ○ | ○ | ○ | ○ | ○ | — | — | 6.3 | 350 |

As listed in Table 1, the ceramic member of Example 1 included boron nitride and forsterite as major components, had coefficient of thermal expansion in a direction parallel to the direction of orientation at 300° C. of $4.5\times10^{-6}$/° C., and had three-point bending strength of 299 MPa.

Furthermore, for the two types of specimens 102 and 103 cut out from the ceramic member of Example 1, thermal expansion in the pressure direction and thermal expansion in a direction perpendicular to the pressure direction were measured in predetermined temperature zones between normal temperature (20° C.) to 300° C. Table 2 is a view indicating the measurement results for each temperature zone. Note that the lower limit of the temperature zones in Table 2 is normal temperature (approximately 20° C.)

TABLE 2

| Temperature (° C.) | Coefficient of thermal expansion ($\times10^{-6}$/° C.) Direction of orientation | Pressure direction |
|---|---|---|
| To 100 | 3.7 | 6.7 |
| To 150 | 3.8 | 6.7 |
| To 200 | 4.0 | 6.9 |
| To 250 | 4.2 | 6.6 |
| To 300 | 4.5 | 7.5 |

Table 2 indicates that the coefficient of thermal expansion of the ceramic member in the direction of orientation was approximately (3.7 to 4.5)$\times10^{-6}$/° C. in all of the temperature zones, and achieved values close to the coefficient of thermal expansion of silicon ($3.4\times10^{-6}$/° C.). By contrast, the coefficient of thermal expansion in a direction parallel to the pressure direction was approximately (6.6 to 7.5)$\times10^{-6}$/° C. As a result, it was obvious that anisotropy related to the coefficient of thermal expansion occurred in the ceramic member according to Example 1.

In order to confirm the orientation of the boron nitride particles described above more precisely, the I.O.P. of the boron nitride particles was calculated by using the ceramic member thus fired of Example 1. The results thereof are indicated in Table 3.

TABLE 3

| Direction of measurement | $I_{(002)}$ | $I_{(100)}$ | $I_{(100)}/I_{(002)}$ | I.O.P. |
|---|---|---|---|---|
| Parallel (‖) | 104907 | 1443 | 0.014 | 0.022 |
| Perpendicular (⊥) | 6843 | 4370 | 0.639 | |

As listed in Table 3, in the ceramic member thus fired, the strength ratio $(I_{(100)}/I_{(002)})\|$ in the case of being irradiated with an X-ray in parallel to the pressure direction was extremely smaller than the strength ratio $(I_{(100)}/I_{(002)})\perp$ in the case of being irradiated with an X-ray perpendicular to the pressure direction. As a result, it was found that, if the ceramic member thus fired is irradiated with the X-ray in parallel to the pressure direction, the strength of the plane (002) of the boron nitride crystal, that is, the strength in the X-ray diffraction in the c-axis direction perpendicular to the surface in a scaly shape was relatively large compared with the strength of the plane (100), that is, the strength in the X-ray diffraction in the a-axis direction along the surface in a scaly shape. Furthermore, in the ceramic member thus fired, the strength ratio $(I_{(100)}/I_{(002)})\perp$ in the case of being irradiated with the X-ray perpendicular to the pressure direction was large. As a result, it was found that, if the ceramic member thus sintered is irradiated with the X-ray perpendicular to the pressure direction, the strength of the plane (100) of the boron nitride crystal, that is, the strength in the X-ray diffraction in the a-axis direction along the plane in a scaly shape was relatively large compared with the strength of the plane (002), that is, the strength in the X-ray diffraction in the c-axis direction perpendicular to the plane in a scaly shape.

By contrast, in order to compare with a state prior to the sintering, a raw material of a ceramic member of Example 4 including boron nitride (BN), silicon nitride ($Si_3N_4$), magnesium oxide (MgO), yttrium oxide ($Y_2O_3$) and aluminum oxide ($Al_2O_3$) was used to measure the strength in the X-ray diffraction ($I_{(002)}$) of the plane (002) of the boron nitride crystal and the strength in the X-ray diffraction ($I_{(100)}$ of the plane (100) for three lots of mixed powder whose particle size was homogenized, and the strength ratio ($I_{(100)}/I_{(002)}$) was calculated for each mixed powder. The results thereof are indicated in Table 4.

TABLE 4

| | $I_{(002)}$ | $I_{(100)}$ | $I_{(100)}/I_{(002)}$ |
|---|---|---|---|
| Lot. 1 | 20085 | 2975 | 0.148 |
| 2 | 17924 | 2911 | 0.162 |
| 3 | 20578 | 2734 | 0.133 |

As described above, because the strength ratio $(I_{(100)}/I_{(002)})\|$ in the case of being irradiated with an X-ray in parallel to the pressure direction was different from the strength ratio $(I_{(100)}/I_{(002)})\perp$ in the case of being irradiated with an X-ray perpendicular to the pressure direction, it was found that the boron nitride crystals were oriented. As evidence of this fact, the I.O.P. was smaller than 1. In comparison with the strength ratio ($I_{(100)}/I_{(002)}$) of 0.13 to 0.16 related to the mixed powder of the raw material assumed to have low orientation of the boron nitride crystals listed in Table 4, it can be further understood that the boron nitride crystals are oriented.

By contrast, in order to confirm machinability, of the ceramic member, a ceramic member with a plate-thickness of 2.70 millimeters was formed from the sintered body in Example 1, and 500 through holes were formed in the ceramic member in a matrix form by drill processing using a carbide drill. The diameter of the through hole was 160 μl (the aspect ratio was 2.70/0.160=16.9), and the hole pitch p (refer to FIG. 5) was 200 μm. As a result, ±5 μm was able to be achieved as the pitch accuracy. In this sense, it was confirmed that the ceramic member manufactured in Example 1 had excellent machinability.

Example 2

In Example 2, by using the method for manufacturing the ceramic member described in the embodiment, the rates of the major components in the raw material (Wt %) and the rates of the sintering additives (Wt %) used in Example 1 were changed, and a sintered body in the same size was fired by the same method as that of Example 1. After the firing, presence of each phase component included in the ceramic member thus fired was analyzed by the X-ray diffraction in the same manner as in Example 1. The results thereof are indicated in Table 1 together with the rates of the major components in the raw material and the sintering additives used in Example 1 (Wt %), sintering temperature (° C.), sintering pressure (MPa), and the coefficient of thermal expansion and the three-point bending strength same as those of Example 1.

As listed in Table 1, the ceramic member of Example 2 included boron nitride and forsterite as major components, had coefficient of thermal expansion in a direction parallel to the direction of orientation of $3.8\times10^{-6}$/° C., and had three-point bending strength of 265 MPa.

Furthermore, by using the specimens 102 and 103 similar to those described above, coefficient of thermal expansion was measured in different temperature zones in the same manner as in Example 1 for the sintered body obtained by the sintering. The measurement results are indicated in Table 5.

TABLE 5

| Temperature (° C.) | Coefficient of thermal expansion ($\times10^{-6}$/° C.) Direction of orientation | Pressure direction |
|---|---|---|
| To 100 | 3.1 | 6.2 |
| To 150 | 3.3 | 6.2 |
| To 200 | 3.4 | 6.4 |
| To 250 | 3.6 | 5.9 |
| To 300 | 3.8 | 7.2 |

Table 5 indicates that the coefficient of thermal expansion of the ceramic member in the direction of orientation was approximately (3.1 to 3.8)$\times10^{-6}$/° C. in all of the temperature zones, and achieved values close to the coefficient of thermal expansion of silicon ($3.4\times10^{-6}$/° C.). By contrast, the coefficient of thermal expansion in a direction parallel to the pressure direction was approximately (5.9 to 7.2)$\times10^{-6}$/° C. As a result, it was obvious that anisotropy related to the coefficient of thermal expansion occurred in the ceramic member according to Example 2.

In Example 2 as well, through holes were formed in the same manner as in Example 1 to confirm the machinability of the ceramic member. As a result, it was confirmed that the ceramic member manufactured in Example 2 had the machinability equivalent to that of the ceramic member manufactured in Example 1.

Example 3

Presence of each phase component included in a fired ceramic member was analyzed in the same manner as in Example 1, and the results thereof are indicated in Table 1 in the same manner as in Example 1.

As listed in Table 1, the ceramic member of Example 3 included boron nitride and forsterite as major components, had coefficient of thermal expansion in a direction parallel to the direction of orientation of $3.8\times10^{-6}$/° C., and had three-point bending strength of 256 MPa.

In Example 3 as well, through holes were formed in the same manner as in Example 1 to confirm the machinability of the ceramic member. As a result, it was confirmed that the ceramic member manufactured in Example 3 had the machinability equivalent to that of the ceramic member manufactured in Example 1.

Example 4

Presence of each phase component included in a fired ceramic member was analyzed in the same manner as in Example 1, and the results thereof are indicated in Table 1 in the same manner as in Example 1.

As listed in Table 1, the ceramic member of Example 4 included boron nitride and forsterite as major components, had coefficient of thermal expansion in a direction parallel to the direction of orientation of $4.5\times10^{-6}$/° C., and had three-point bending strength of 273 MPa.

In Example 4 as well, through holes were formed in the same manner as in Example 1 to confirm the machinability of the ceramic member. As a result, it was confirmed that the ceramic member manufactured in Example 4 had the machinability equivalent to that of the ceramic member manufactured in Example 1.

Example 5

Presence of each phase component included in a fired ceramic member was analyzed in the same manner as in Example 1, and the results thereof are indicated in Table 1 in the same manner as in Example 1.

As listed in Table 1, the ceramic member of Example 5 included boron nitride, forsterite, and magnesium oxide as major components, had coefficient of thermal expansion in a direction parallel to the direction of orientation of $4.5\times10^{-6}$/° C., and had three-point bending strength of 300 MPa.

In Example 5 as well, through holes were formed in the same manner as in Example 1 to confirm the machinability of the ceramic member. As a result, it was confirmed that the ceramic member manufactured in Example 5 had the machinability equivalent to that of the ceramic member manufactured in Example 1.

Example 6

Presence of each phase component included in a fired ceramic member was analyzed in the same manner as in Example 1, and the results thereof are indicated in Table 1 in the same manner as in Example 1.

As listed in Table 1, the ceramic member of Example 6 included boron nitride, forsterite, and magnesium oxide as major components, had coefficient of thermal expansion in a direction parallel to the direction of orientation of $4.4\times10^{-6}$/° C., and had three-point bending strength of 315 MPa.

In Example 6 as well, through holes were formed in the same manner as in Example 1 to confirm the machinability of the ceramic member. As a result, it was confirmed that the ceramic member manufactured in Example 6 had the machinability equivalent to that of the ceramic member manufactured in Example 1.

Example 7

Presence of each phase component included in a fired ceramic member was analyzed in the same manner as in Example 1, and the results thereof are indicated in Table 1 in the same manner as in Example 1.

As listed in Table 1, the ceramic member of Example 7 included boron nitride, forsterite, and magnesium oxide as major components, had coefficient of thermal expansion in a direction parallel to the direction of orientation of $4.7\times10^{-6}$/° C., and had three-point bending strength of 302 MPa.

In Example 7 as well, through holes were formed in the same manner as in Example 1 to confirm the machinability of the ceramic member. As a result, it was confirmed that the ceramic member manufactured in Example 7 had the machinability equivalent to that of the ceramic member manufactured in Example 1.

Example 8

Presence of each phase component included in a fired ceramic member was analyzed in the same manner as in Example 1, and the results thereof are indicated in Table 1 in the same manner as in Example 1.

As listed in Table 1, the ceramic member of Example 8 included boron nitride and forsterite as major components, had coefficient of thermal expansion in a direction parallel to the direction of orientation of $3.1\times10^{-6}$/° C., and had three-point bending strength of 262 MPa.

In Example 8 as well, through holes were formed in the same manner as in Example 1 to confirm the machinability of the ceramic member. As a result, it was confirmed that the ceramic member manufactured in Example 8 had the machinability equivalent to that of the ceramic member manufactured in Example 1.

Comparative Examples 1 to 10

For comparison, ceramic members of Comparative Examples 1 to 10 were fired by changing the rates of the raw material and the sintering additives (Wt %), sintering temperature (° C.), and sintering pressure (Mpa) variously. Subsequently, presence of each phase component included in the ceramic members thus fired, coefficient of thermal expansion ($\times10^{-6}$/° C.), and three-point bending strength were measured in the same manner as in Examples 1 to 8. The rates of major components in the raw material and the sintering additives used in Comparative Examples 1 to 10 (Wt %), sintering temperature (° C.), sintering pressure (MPa), presence of each phase component included in the ceramic members thus fired, coefficient of thermal expansion ($\times10^{-6}$/° C.), and three-point bending strength are indicated in Table 1.

As listed in Table 1, in the ceramic members of Comparative Examples 1 to 10, no forsterite was included, or the coefficient of thermal expansion was out of a range of (3 to 5)$\times10^{-6}$/° C., or three-point bending strength was lower than 250 MPa even if the coefficient of thermal expansion was in a range of (3 to 5)$\times10^{-6}$/° C.

INDUSTRIAL APPLICABILITY

As described above, the ceramic member of the present invention is preferably used for a material of a probe holder into which a probe that electrically connects a circuit structure of an object of a test and a circuit structure that transmits a signal used for the test is inserted in a micro contactor used for a test for a semiconductor or a test for liquid crystal. The manufacturing method of the present invention is preferably used for manufacturing a ceramic member for the probe holder.

Reference Signs List

| | |
|---|---|
| 1 | PROBE HOLDER |
| 1A, 1B | SURFACE |
| 2 | PROBE CARD |
| 3 | PROBE |
| 4 | SPACE TRANSFORMER |
| 5 | INTERPOSER |
| 6 | WIRING BOARD |
| 7 | MALE CONNECTOR |
| 8 | REINFORCING MEMBER |
| 9 | SILICON WAFER |
| 11 | THROUGH HOLE |
| 11a | LARGE-DIAMETER PORTION |
| 11b | SMALL-DIAMETER PORTION |
| 31, 32 | NEEDLE MEMBER |
| 33 | SPRING MEMBER |
| 41, 91 | ELECTRODE PAD |
| 101 | SINTERED BODY |
| 102, 103 | SPECIMEN |
| S | MINUTE REGION |
| w | WIRING |

The invention claimed is:

1. A ceramic member being a sintered body and comprising at least forsterite and boron nitride as major components, wherein the boron nitride is oriented in one direction.

2. The ceramic member according to claim 1, wherein an index of orientation preference is equal to or lower than 0.07, the index of orientation preference being calculated by $(I_{(100)}/I_{(002)})\|/(I_{(100)}/I_{(002)})\perp$ using a ratio $(I_{(100)}/I_{(002)})\|$ of strength $I_{(100)}$ in an X-ray diffraction along a plane (100) to strength $I_{(002)}$ in an X-ray diffraction along a plane (002) of a boron nitride crystal when being irradiated with an X-ray in a direction perpendicular to a direction of orientation of the boron nitride, and a ratio $(I_{(100)}/I_{(002)})\perp$ of the strength $I_{(100)}$ in the X-ray diffraction along the plane (100) to the strength $I_{(002)}$ in the X-ray diffraction along the plane (002) when being irradiated with an X-ray in the direction of orientation.

3. The ceramic member according to claim 1, wherein coefficient of thermal expansion based on JIS R 1618 at 20 to 300° C. in a direction parallel to the direction of orientation of the boron nitride is (3 to 5)$\times10^{-6}$/° C.

4. The ceramic member according to claim 1, wherein three-point bending strength based on JIS R 1601 is equal to or higher than 250 MPa.

5. The ceramic member according to claim 1, wherein the boron nitride has a hexagonal crystal structure, and is a scaly particle.

6. A probe holder that includes a through hole into which a probe formed of a conductive material is capable of being inserted, and that houses the probe, the probe holder comprising:

a base material formed by using a ceramic member being a sintered body and comprising at least forsterite and boron nitride as major components, wherein the boron nitride is oriented in one direction, wherein the through hole is formed in a direction perpendicular to the direction of orientation of the boron nitride in the base material.

* * * * *